United States Patent [19]

Hiroe et al.

[11] Patent Number: 5,191,908
[45] Date of Patent: Mar. 9, 1993

[54] DIPPING TYPE SURFACE TREATMENT APPARATUS

[75] Inventors: Toshio Hiroe; Kenji Sugimoto, both of Shiga, Japan

[73] Assignee: Dainippon Screen Mfg. Co., Ltd., Japan

[21] Appl. No.: 815,323

[22] Filed: Dec. 27, 1991

[30] Foreign Application Priority Data

Dec. 28, 1990 [JP] Japan ............... 2-406312[U]

[51] Int. Cl.⁵ .............................................. B08B 3/02
[52] U.S. Cl. .................... 134/76; 134/102.1; 134/140; 134/902
[58] Field of Search ............ 134/76, 95, 102, 200, 134/902, 137, 140, 182, 95.2, 99.1, 100.1, 102.1

[56] References Cited

U.S. PATENT DOCUMENTS

| | | | |
|---|---|---|---|
| 2,181,177 | 11/1939 | Davis | 134/102 X |
| 3,893,869 | 7/1975 | Mayer et al. | 134/902 X |
| 4,520,834 | 6/1985 | DiCiclo | 134/902 X |
| 4,694,527 | 9/1987 | Yoshizawa | 134/902 X |
| 4,839,979 | 6/1989 | Nishida et al. | 134/902 |

FOREIGN PATENT DOCUMENTS

| | | | |
|---|---|---|---|
| 1238022 | 9/1989 | Japan . | |
| 1-261829 | 10/1989 | Japan | 134/902 |
| 2018831 | 10/1979 | United Kingdom | 134/102 |

Primary Examiner—Frankie L. Stinson
Attorney, Agent, or Firm—Ostrolenk, Faber, Gerb & Soffen

[57] ABSTRACT

A dipping type wafer treatment apparatus includes housing having first and second openings, a wafer treatment bath provided inside the housing, a clean air unit for producing a downflow, a flow rectifier for introducing the downflow into the housing, a communicating chamber provided below the housing being partitioned from a space inside the housing, a duct for guiding mist in the vicinity of the treatment bath in the housing into the communicating chamber together with the downflow, and a pump for forcing air out of the communicating chamber from an air outlet provided in the communicating chamber.

16 Claims, 11 Drawing Sheets

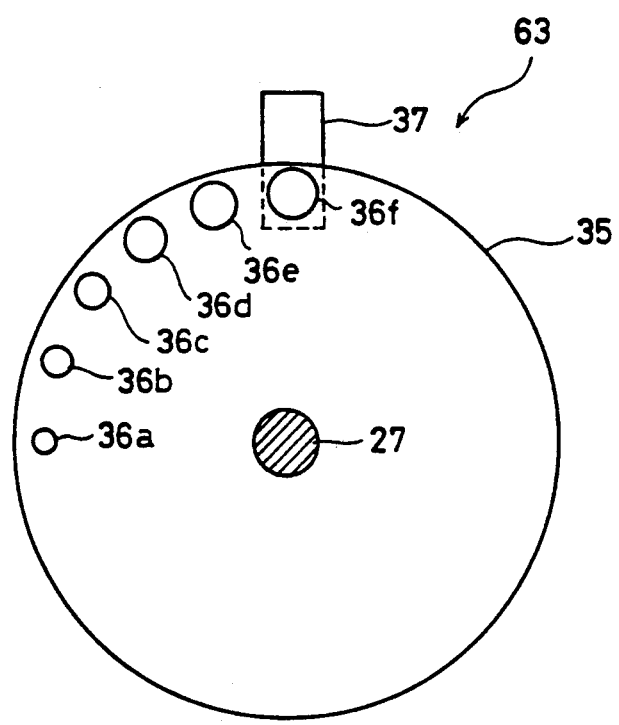

DIPPING TYPE SURFACE TREATMENT APPARATUS

BACKGROUND OF THE INVENTION

1. Field of the Invention

The present invention relates to dipping type wafer treatment apparatus for treating surfaces of laminated wafers such as semiconductor substrates or liquid crystal glass substrates (hereinafter simply referred to as a wafer), and particularly to a wafer treatment apparatus capable of efficiently exhausting mist produced from a treatment solution.

2. Description of the Related Art

Conventional wafer treatment apparatus of this kind is disclosed in FIG. 1 of Japanese Patent Laying-Open No. 2-238022 (Title of the Invention "Semiconductor Treatment Apparatus") shown in FIG. 1. As shown in FIG. 1, a conventional apparatus 101 includes a surface treatment chamber 102A, a plurality of surface treatment baths 103 provided in a series in the surface treatment chamber 102A, and a conveyor robot 110 for sequentially conveying a carrier 104 in which a wafer W is accommodated to dip it into each treatment bath 103 for performing different kinds of surface treatments. A sidewall 114 defines surface treatment chamber 102A and a side chamber 102B around surface treatment baths 103 in four directions. An air outlet 122 is formed in a rear sidewall of surface treatment chamber 102A and a forced exhaust duct 123 is connected thereto. A clean air flow F is supplied from top to bottom in surface treatment chamber 102A and treatment solution mist produced from surface treatment bath 103 is forced out together with the downflow F of clean air. Apparatus 101 is installed on a floor beam 140 of the waffle slab structure.

In the above-described conventional example, as shown in FIG. 1, air outlet 122 is formed in the rear sidewall of surface treatment chamber 102A, and forced exhaust duct 123 is connected thereto. It causes such problems as follows.

As it is near the air outlet 122, the exhaustion effect on the rear side of surface treatment bath 103 is strong. However, as it is spaced away from air outlet 122, the exhaustion effect is weak on the front side of surface treatment bath 103, resulting in a difficulty in smoothly exhausting the treatment solution mist.

Another problem is as follows. This kind of apparatus is generally installed on floor beam 140 with the waffle slab structure as shown in FIG. 1. In some installing places, forced exhaust duct 123 interferes with floor beam 140. Accordingly, as shown by the phantom line, forced exhaust duct 123 must be connected by a tube in a manner largely drawn out to the rear side of wafer treatment apparatus 101. Therefore, for providing the conventional apparatus, it is necessary to re-design the pipe arrangement corresponding to an installation place.

SUMMARY OF THE INVENTION

One object of the present invention is to implement efficient exhaustion of treatment solution mist.

It is another object of the present invention to efficiently exhaust treatment solution mist and facilitate arrangement of a forced exhaust duct.

It is still another object of the present invention to provide a dipping type wafer treatment apparatus in which treatment solution mist smoothly flows to an air outlet and the arrangement of a forced exhaust duct is easy.

It is an additional object of the present invention to establish a flow of mist of a treatment solution in a substantially constant direction to an air outlet and facilitate arrangement of a forced exhaust duct.

It is still another additional object of the present invention to enable adjustment of an exhaust speed corresponding to an amount of produced mist of a treatment solution and facilitate arrangement of a forced exhaust duct.

It is yet another object of the present invention to provide a dipping type wafer treatment apparatus in which treatment solution mist can be efficiently exhausted and, wherever a forced exhaust duct is provided, it does not affect a flow of treatment solution mist inside the apparatus.

A dipping type wafer treatment apparatus according to the present invention includes a housing having first and second openings through which a wafer can pass respectively for defining a space in which a wafer is treated, a wafer treatment bath provided inside the housing, a clean air unit for producing a downflow of air provided above the housing, a flow rectifier provided at an upper portion of the housing for introducing a downflow of air down into the housing, a bottom enclosing member provided below the housing being partitioned from inside of the housing, defining a closed space in which gas can flow, and having an air outlet to outside, a first communication duct for guiding air in the vicinity of the treatment bath inside the housing into the closed space, and a pump for forcing out the air in the closed space.

In this apparatus, mist of a treatment solution produced from the treatment bath is guided into a closed space defined by the bottom enclosing member by the first duct together with the downflow in the housing and forced out by the pump. The flow of the treatment solution mist is smooth and the treatment solution mist is easily exhausted out of the housing. The pump is coupled to an air outlet of the bottom enclosing member. A position of the air outlet of the bottom enclosing member can be set at an arbitrary position of a bottom wall of the bottom enclosing member. It is not necessary to connect a forced exhaust duct to a housing side portion as in a conventional case, which facilitates provision of a forced exhaust duct irrespective of its installation place.

Preferably, the apparatus includes a device provided associated with the first opening for forming an air curtain by guiding an air flow from the clean air unit to the first opening to flow it down along an outer wall of the housing, and a duct for further guiding the air flow forming the air curtain into the closed space. More preferably, the apparatus further includes a partially sealing plate movable between a first position for sealing an upper part of the first opening and a second position for substantially opening the first opening.

In such a dipping type wafer treatment apparatus, the air curtain separates the inside and outside of the housing. Particles outside the housing are prevented from invading the housing. Accordingly, a wafer can be treated favorably. Since the first opening is sealed by the air curtain, a wafer conveyor robot can pass wafers through the first opening. Therefore, according to the apparatus, automatic wafer treatment can be applied. When the partially sealing plate is provided, the screening effect can be produced more favorably between inside and outside the housing by the air curtain when the partially sealing plate is at the first position. Accordingly, wafer treatment can be performed more preferably.

According to another preferred embodiment of the present invention, the dipping type wafer treatment apparatus further includes a wafer conveyor robot, a cover for opening/closing an opening of a treatment bath, an exhausted amount adjusting valve for controlling an amount of air exhausted through the air outlet from the closed space, and a driving device for driving the cover and the exhausted amount adjusting valve in association with dipping and retrieving of wafers into and from the treatment bath by the wafer conveyor robot.

In an apparatus of this preferred embodiment, except when wafers are dipped into and retrieved from the treatment bath, the cover closes the treatment bath. Accordingly, an amount of produced solution mist from the treatment bath decreases. When the cover is opened, the exhausted amount adjusting valve is driven by the controlling device to increase an exhaust amount from the housing. Therefore, the treatment solution mist inside the housing can be rapidly exhausted. When the amount of produced treatment solution mist is small, the exhausted amount adjusting valve is controlled to reduce the exhaust amount from the housing. Accordingly, a required exhausted amount can be implemented in proper quantities, resulting in efficient exhaustion.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view of a disk having light transmitting apertures.

DESCRIPTION OF THE PREFERRED EMBODIMENTS

Figure 1:
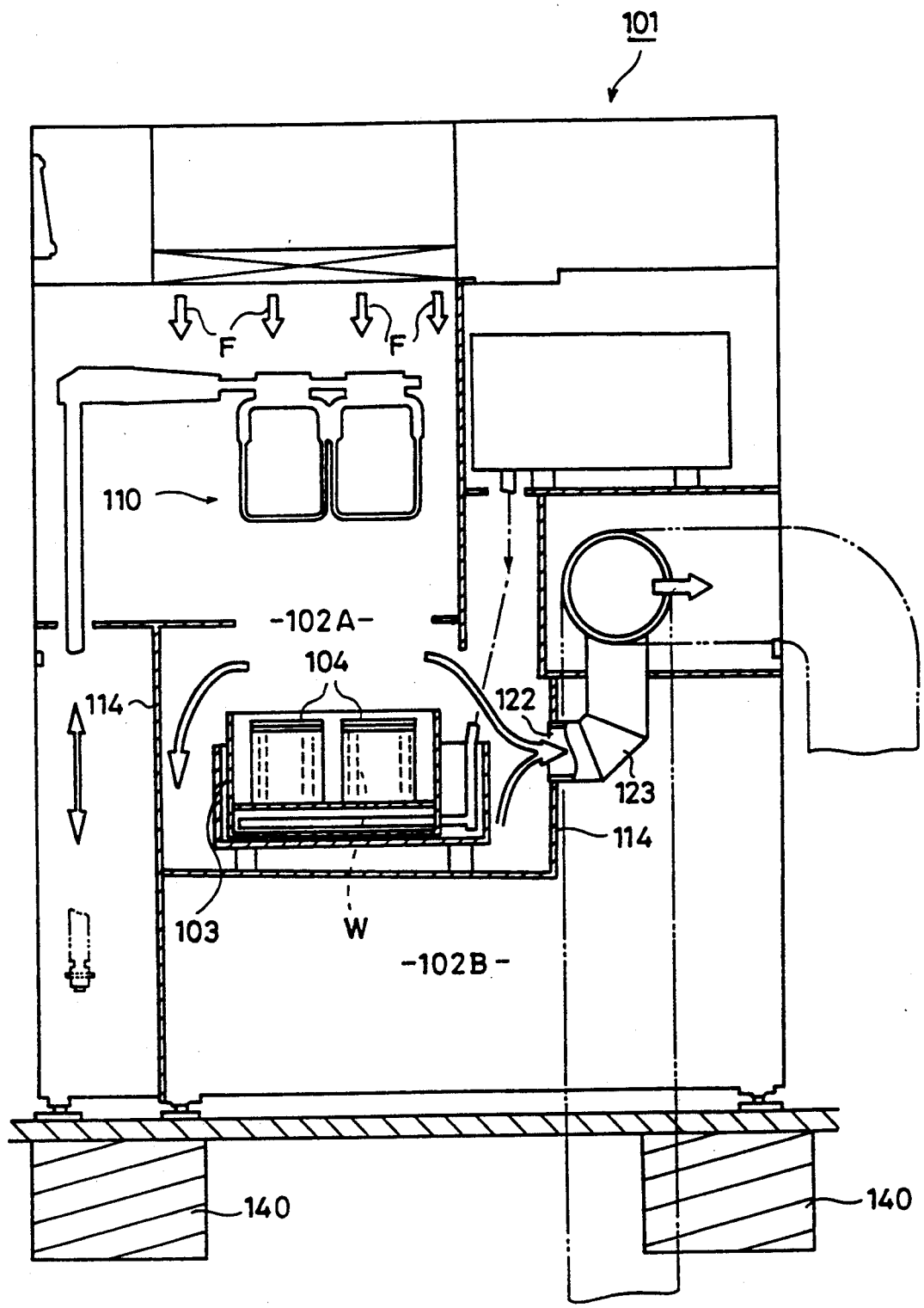
FIG. 1 is a schematic cross-sectional diagram of a conventional dipping type wafer treatment apparatus.
Figure 2:
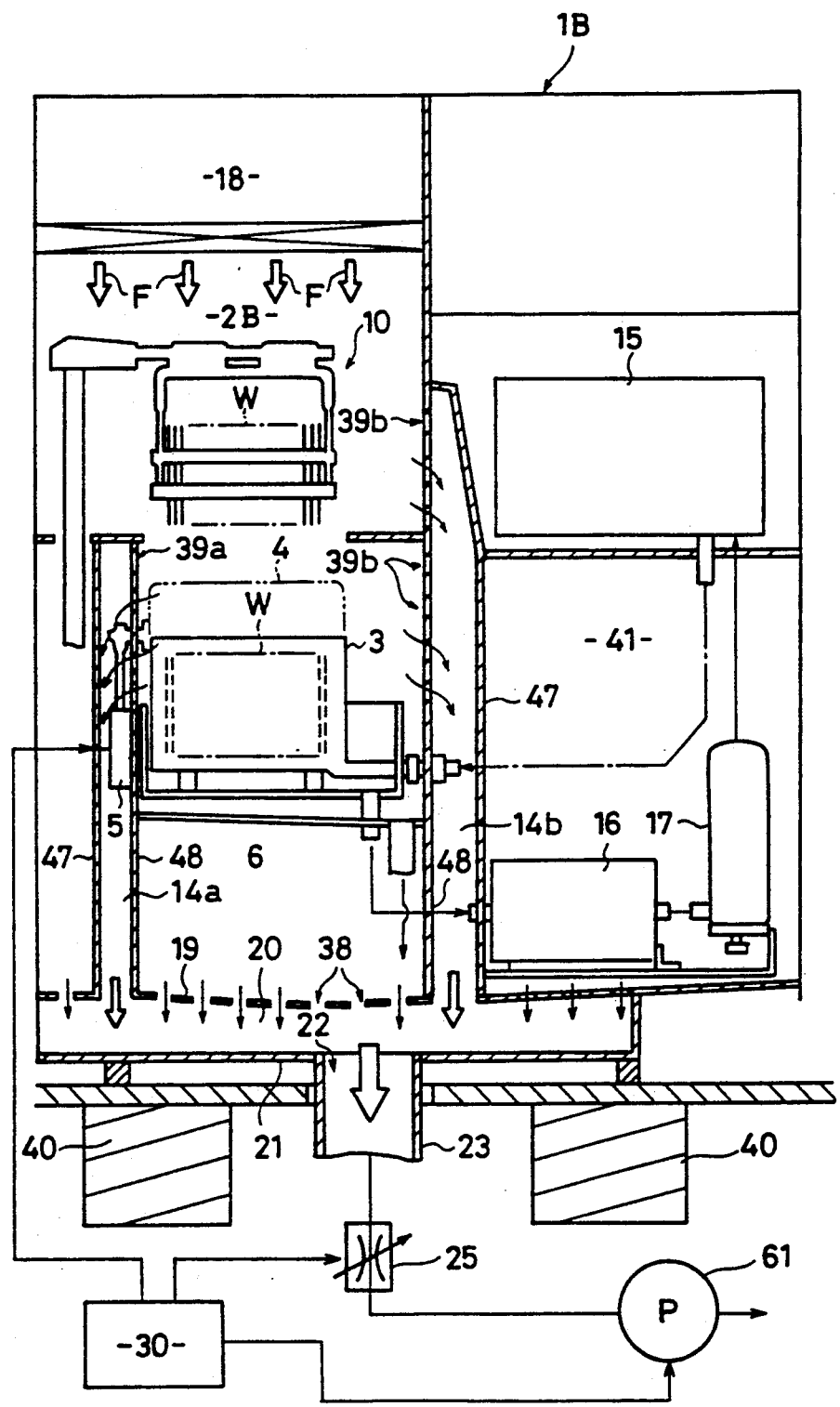
FIG. 2 is a schematic side-sectional view of a dipping type wafer treatment apparatus according to the present invention.
Figure 3:
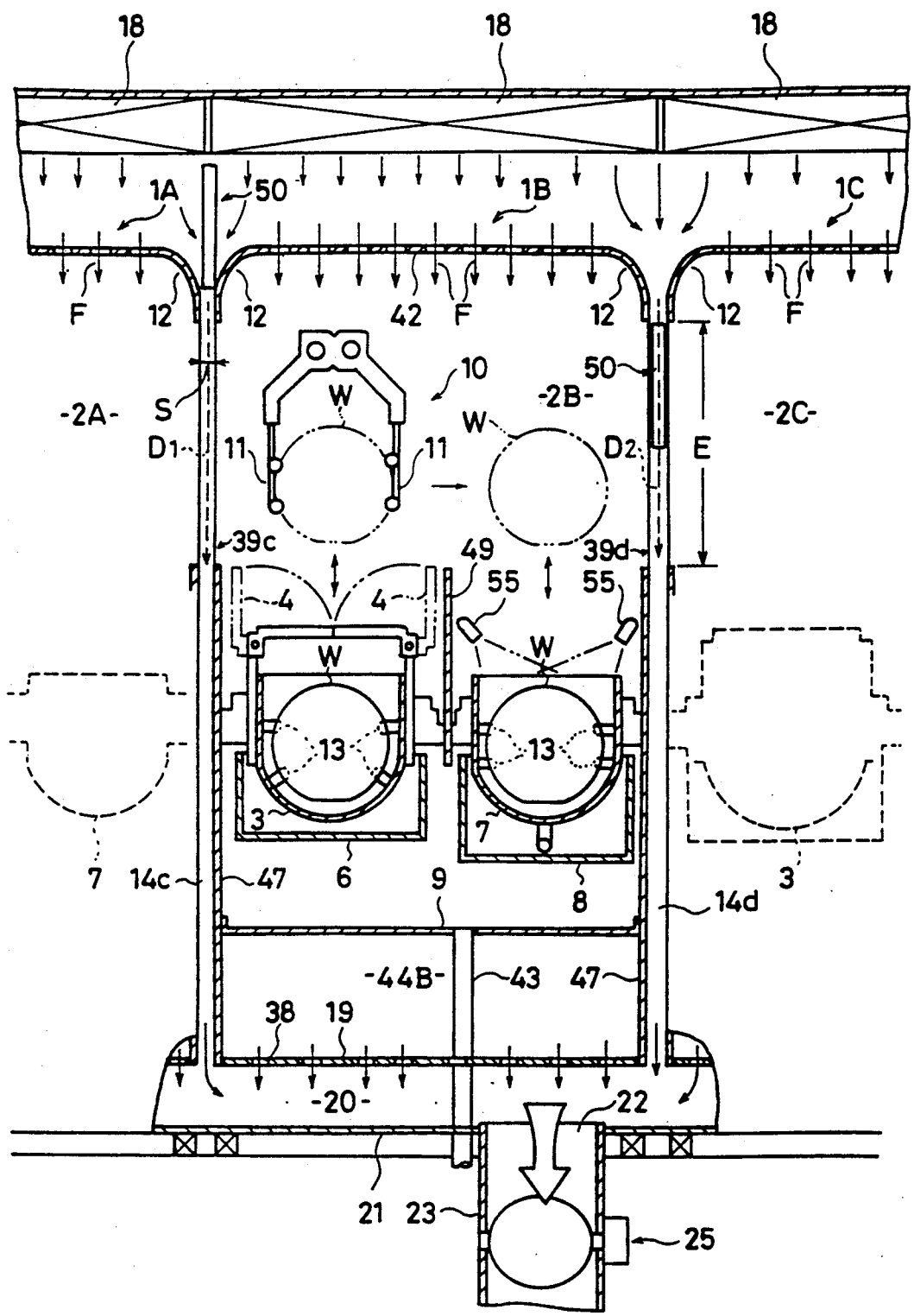
FIG. 3 is a schematic front-sectional view of the apparatus shown in FIG. 2.

Referring to FIGS. 2 and 3, a dipping type wafer treatment apparatus according to a first preferred embodiment of the present invention includes a plurality of surface treatment devices 1A, 1B and 1C provided in series with predetermined gaps S therebetween for performing different surface treatment processes, clean air units 18 provided in upper parts of respective surface treatment devices IA, IB and 1C for forming a downflow F of clean air, and a bottom communicating chamber 20 partitioned in lower parts of respective surface treatment devices 1A, 1B and 1C. The bottom communicating chamber 20 is partitioned by a bottom wall 21 in its lower portion. The bottom wall 21 has an air outlet 22. A forced exhaust duct 23 is coupled to air outlet 22 and a flow rate adjusting valve 25 is provided therein.

Respective surface treatment devices 1A, 1B and 1C have substantially the same structure. For example, the surface treatment device 1B includes a flow rectifier 42 having a large number of holes through which the down flow F passes, a sidewall 47 and a separating wall 19 having a large number of holes 38 for separating the bottom from bottom communicating chamber 20. Flow rectifier 42, sidewall 47 and separating wall 19 define a surface treatment chamber 2B therein. Guide plates 12 are attached to edges of flow rectifier 42 for guiding the downflow F into the gap S between adjacent surface treatment devices. An opening having a height E through which a robot 10 for conveying wafer W can pass is formed between a lower end of guide plate 12 and sidewall 47.

An etching bath 3 and a rinsing bath 7 are provided inside surface treatment chamber 2B. Below the etching bath 3 and the rinsing bath 7, a common drain tray 9 is provided. Common drain tray 9 defines a piping chamber 44 below it. A drain pipe 43 is provided extending from common drain tray 9 to outside below the apparatus.

A pair of lids 4 for opening and closing an opening of etching bath 3 are hinged to etching bath 3. An overflow receptacle 6 for receiving etching solution overflowing from etching bath 3 is provided just below etching bath 3. A wafer holder 13 for holding a plurality of wafers W is provided inside etching bath 3. A rotary actuator 5 for driving lids 4 is provided on the back of etching bath 3.

A partition 49 for partitioning etching bath 3 and rinsing bath 7 is provided between an upper portion of etching bath 3 and an upper portion of rinsing bath 7. A wafer holder 13 for holding a plurality of wafers W is also provided inside rinsing bath 7. Nozzles 55 for directing a rinsing solution toward wafers W are provided above rinsing bath 7. An overflow receptacle 8 for receiving a rinsing solution overflowing from rinsing bath 7 is provided below rinsing bath 7.

Referring to FIG. 2, a duct wall 48 is provided between baths 3 and 7 and sidewall 47, where communicating ducts 14a, 14b are formed by sidewall 47 and duct wall 48. Communicating ducts 14c and 14d are formed by sidewall 47 in gaps S respectively between adjacent treatment devices. Air inlets 39a and 39b are provided in duct wall 48 in the vicinity of etching bath 3. Air inlets 39c and 39d are formed at upper edges of communicating ducts 14c and 14d. Lower portions of communicating ducts 14a through 14d open into bottom communicating chamber 20.

A side chamber 41 partitioned from surface treatment chamber 2B by sidewall 47 is provided inside the housing of surface treatment device 1B. A treatment solution measuring tank 15 is provided above side chamber 41. A filter 17 is provided below treatment solution measuring tank 15. A pump 16 for circulating a treatment solution is provided behind filter 17. Pump 16, filter 17, treatment solution measuring tank 15, etching bath 3 and pump 16 are coupled each other by piping in this order. The treatment solution supplied from treatment solution measuring tank 15 into etching bath 3 returns to treatment solution measuring tank 15 through filter 17 pressured by pump 16.

Referring to FIG. 2, surface treatment device IB and the like are provided on floor beam 40 with the waffle slab structure. Forced exhaust duct 23 is connected to forced exhaust pump 61. Flow rate adjusting valve 25 is provided between air outlet 22 and pump 61. Rotary actuator 5, flow rate adjusting valve 25 and pump 61 are controlled by a common controlling circuit 30.

Referring to FIG. 3, robot 10 holds a plurality of wafers W with a pair of hands 11 and sequentially moves among surface treatment chambers 2A, 2B, 2C. Robot 10 sequentially dips wafers W into respective baths 3, 7 inside respective surface treatment chambers 2A, 2B and 2C.

Figure 4A:
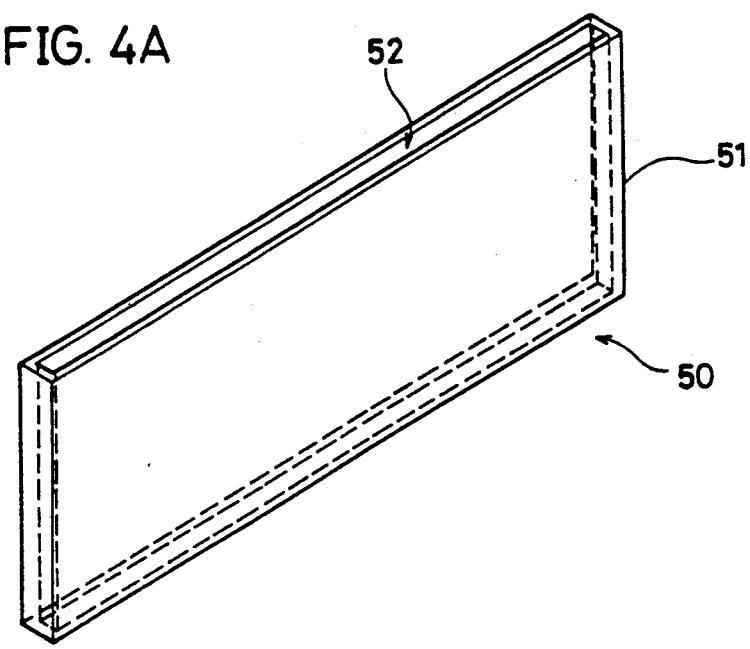
FIG. 4A is a schematic perspective view of a shutter used for partially sealing an opening of apparatus according to the present invention.

A shutter mechanism 50 capable of covering an upper half of an opening provided on a side face of each surface treatment device is provided in an upper portion of gap S between surface treatment devices. Referring to FIG. 4A, the shutter mechanism 50 includes a shutter plate 51 having an air path 52 formed from its upper edge to lower edge and a driving mechanism not shown for moving shutter plate 51 upward and downward.

Figure 4B:
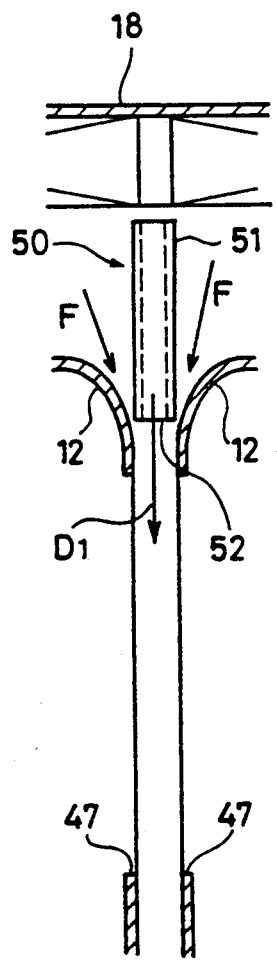
FIGS. 4B and 4C are schematic cross-sectional views of a housing end illustrating operation of the shutter used in FIG. 4A.

Referring to FIG. 4B, when the robot 10 holding wafers W passes through the opening, shutter plate 51 is drawn up above guide plate 12. At this time, the downflow F is guided by the lower parts of both sides of the pulled up guide plate 51 toward gap S to form an air shutter $D_1$ together with the downflow passing through the air path 52 of shutter plate 51. Air inside two surface treatment chambers do not mix each other by the air shutter $D_1$.

Generally, different treatments are effected in such surface treatment devices 1A, 1B and 1C. For example, suppose that acid mist rises inside surface treatment chamber 2A and alkaline mist rises in surface treatment chamber 2B. If they mix each other, salt is produced. The salt forms particles which attach to the wafers. With such contamination of wafers, the product yield decreases. The air curtains formed among respective surface treatment devices 1A, 1B and 1C are for avoiding such a problem.

Figure 4C:
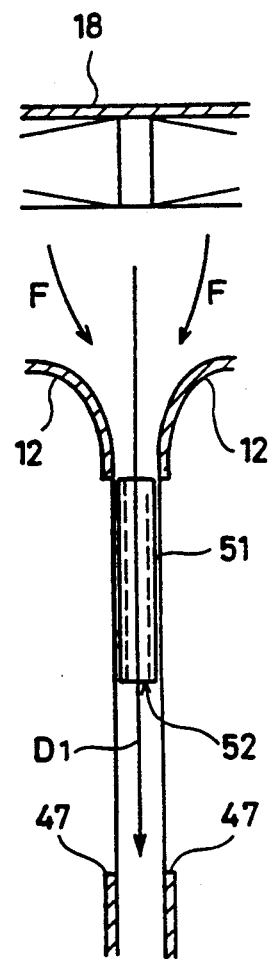

Referring to FIG. 4C, after wafer conveyor robot 10 passes the opening, shutter plate 51 is brought down into gap S. Shutter plate 51 is located at a position at which the upper half of the opening of the surface treatment device is closed. The downflow F formed by clean air unit 18 is guided into air path 52 of shutter plate 51 by guide plates 12. The downflow F gets out from the lower opening of air path 52 to form air shutter $D_1$. Since the lower end of shutter plate 51 and the upper end of the lower side wall 47 are closer, the separation between two surface treatment chambers by the air shutter $D_1$ is more perfect as compared with the case shown in FIG. 4B.

Figure 5:
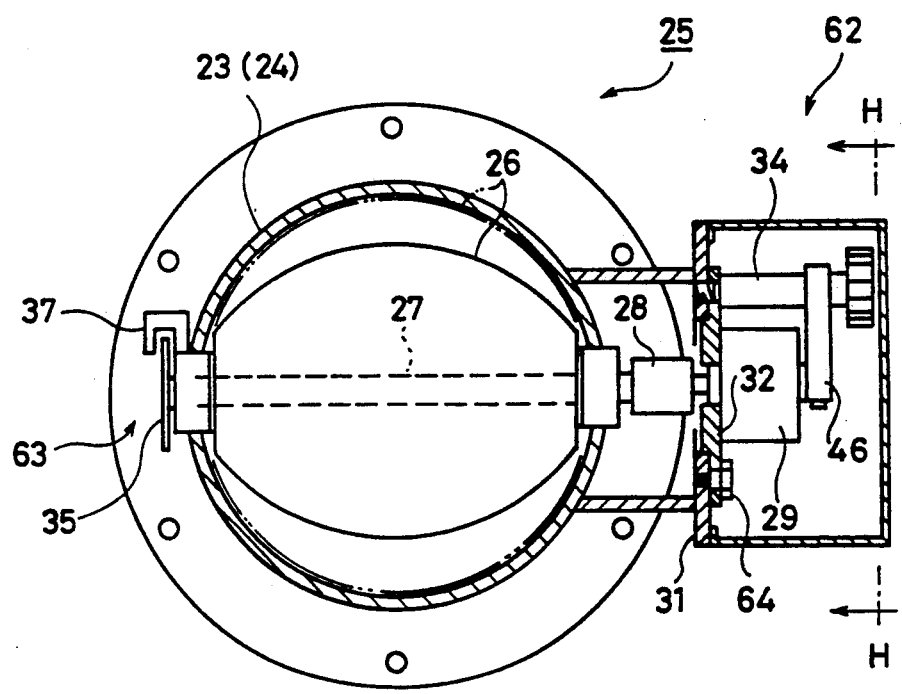
FIG. 5 is a cross-sectional view of a flow rate adjusting valve.

Referring to FIG. 5, flow rate adjusting valve 25 includes a support rod 27 rotatably provided inside forced exhaust duct 23, a disk-shaped valve element 26 attached to support rod 27, a driving device 62 attached to a peripheral wall of forced exhaust duct 23 for rotating support rod 27 by a predetermined angle, and an opening angle detecting device 63 provided at an end of support rod 27 on the side opposite to driving device 62 for detecting the opening angle of the flow path from the rotated angle of valve element 26.

The driving device 62 includes a base frame 31 fixed on an external side of forced exhaust duct 23, a rotary actuator 29 attached to a central portion of base frame 31 for rotating support rod 27, a coupling 28 for coupling a driving axis of rotary actuator 29 with support rod 27, a manually operable opening angle adjusting plate 32 provided between rotary actuator 29 and base frame 31 for adjusting the rotation angle of support rod 27 by rotary actuator 29, an opening angle adjusting stopper 34 fixed to base frame 31, and stopper arm 46 fixed to the driving axis of rotary actuator 29, rotating around the driving axis with rotation of the driving axis of rotary actuator 29 and abutting on stopper 34 to regulate the opening angle of valve element 26.

Figure 6:
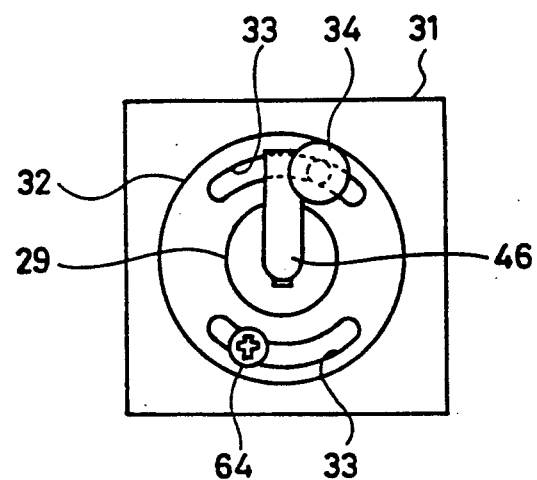
FIG. 6 is a side view of the flow rate adjusting valve seen in the direction of the arrow along the H—H line in FIG. 5.

Referring to FIG. 6, a pair of arc-shaped long holes 33 are provided in adjusting plate 32. Stopper 34 is inserted into one of the long holes 33. A screw 64 is inserted into the other long hole 33 for fixing the adjusting plate 34 at a predetermined position. The screw 64 is mated with a screw hole (not shown) provided in base frame 31.

Referring to FIG. 7, opening angle detecting device 63 includes a disk 35 having its center fixed to one-end of support rod 27 and having holes 36a through 36f with different dimensions, and an optical sensor 37 provided opposing to one face of disk 35 at a position at which it can detect holes 36a through 36f passing therethrough. Holes 36a through 36f are respectively provided at positions so that the opening angle of valve element 26 changes from 0 to 100% at pitches of 20% in exhaust amount Diameters of respective holes 36a through 36f are previously determined. By detecting an amount of light passing through hole 36f by sensor 37, it can be known which one of holes 36a through 36f is located at the position opposing to sensor 37. Accordingly, it is possible to desirably adjust the opening angle of valve element 26 on the basis of an output of sensor 37. This is because required amount of exhausted mist differs since an amount of mist produced from a treatment solution differs due to conditions such as a type and quality of a treatment solution used in the surface treatment apparatus and a treatment temperature. When automatically adjusting the opening angle, it is necessary to keep free stopper arm 64 shown in FIGS. 5 and 6.

It should be noted that the opening angle of valve element 26 is not automatically set in this embodiment. The opening angle of valve element 26 is controlled by opening angle adjusting plate 32 and stopper 34.

Referring to FIGS. 2 through 6, surface treatment device 1B according to the first embodiment of the present invention operates as follows. Pump 16 circulates an etching solution in treatment solution measuring tank 15 inside the pipe. A predetermined amount of etching solution is always contained in etching bath 3. Unnecessary substances inside the etching solution are removed by filter 17. Lids 4 of etching bath 3 are usually closed. Shutter plates 51 of two openings provided in surface treatment device 1B are at lower positions. Flow rate adjusting valve 25 controls the exhaust amount flowing in forced exhaust duct 23 to a predetermined first amount. Pump 61 exhausts air inside bottom communicating chamber 20 from air outlet 22 to produce a negative pressure inside bottom communicating chamber 20.

The downflow F from clean air unit 18 is guided into communicating ducts 14a through 14d from air outlets 39a through 39d and further guided by the negative pressure inside bottom communicating chamber 20 to be led to bottom communicating chamber 20. The mist produced from the etching solution inside etching bath 3 is small in quantity because lids 4 are closed. The mist is guided into exhausting ducts 14a through 14d together with the downflow F and exhausted to outside through forced exhaust duct 23 from bottom communicating chamber 20.

The wafers W are introduced into surface treatment device 1B as follows. Shutter plate 51 between surface treatment devices 1A and 1B is pulled up as shown in FIG. 4B. Robot 10 moves from surface treatment device 1A to surface treatment device 1B while holding wafers W with hands 11. When robot 10 passes the opening, shutter plate 51 between surface treatment devices 1A and 1B is lowered to a lower position shown in FIG. 4C. The area of the opening between surface treatment devices 1A, 1B is reduced and air curtain $D_1$ is formed by a downflow jetted out from air path 52 of shutter plate 51. Air curtain $D_1$ prevents air of surface treatment chambers 2A and 2B from mixing.

The etching process of wafers W is performed as follows. The controlling circuit 30 shown in FIG. 2 drives rotary actuator 5 to open lids 4. Controlling circuit 30 simultaneously increases the exhaust power of pump 61 to maximize the opening angle of flow rate adjusting valve 25. The lids 4 are opened and the mist produced from the etching solution increases in quantity. However, by pump 61 and flow rate adjusting valve 25, a large negative pressure is produced inside bottom communicating chamber 20. The downflow F is more quickly guided into exhaust ducts 14a through 14d from air inlets 39a through 39d to reach bottom communicating chamber 20. The mist of treatment solution is also exhausted out through forced exhaust duct 23 from bottom communicating chamber 20 quickly together with the downflow F.

Robot 10 lowers and provides wafers W on wafer holder 13 in etching bath 3 and rises again. When robot 10 sufficiently rises, the controlling circuit 30 closes lids 4 again. Then, after a predetermined time has passed, the power of pump 61 is decreased and the opening angle of flow rate adjusting valve 25 is also adjusted to be small. After a predetermined time required for etching has passed, controlling circuit 30 opens lids 4 again. The power of pump 61 is increased and the opening angle of flow rate adjusting valve 25 is also adjusted to be large. Robot 10 is again lowered to lift up wafers W from etching bath 3. When robot 10 and wafers W sufficiently ascend, the lids 4 close again. Wafers W are moved to the rinsing step by the rinsing bath 7 thereafter.

The rinsing process is performed as follows. Robot 10 moves to rinsing bath 7 while holding wafers W. Robot 10 lowers and places wafers W on wafer holder 13 inside rinsing bath 7. When wafer conveyor robot 10 sufficiently rises, a rinsing solution is jetted toward wafers W from nozzle 55. The mist of etching solution produced from etching bath 3 in this period is small in amount, so that the power of pump 61 is small and the opening angle of flow rate adjusting valve 25 is also made small. After completion of rinsing for a predetermined time, robot 10 is again lowered and lifts up wafers W from rinsing bath 7. Treatment in surface treatment chamber 2B is thus completed, and wafers W are transferred to the next process performed in surface treatment device 1C.

The wafers W are discharged from surface treatment chamber 2B as follows. Shutter plate 51 between surface treatment devices 1B and 1C is pulled up. Robot 10, holding wafers W, passes through the opening between surface treatment devices 1B and 1C to move into surface treatment chamber 2C When robot 10 passes the opening, shutter plate 51 descends again to close an upper half of the opening. Accordingly, the area of the opening is kept smaller than that when there is not shutter plate 51, and the mutual sealing of surface treatment chambers 2B and 2C by air shutter $D_2$ can be favorably made.

Adjusting plate 32 shown in FIGS. 5 and 6 is adjusted in advance to an appropriate position selected corresponding to the type of an etching solution by manual operation. In more detail, the opening angle of valve element 26 is set as described below, for example. Assuming that the exhaust amount required when a solution for treating surfaces is nitric acid of 100° C. is represented as 100%, the opening angle of valve element 26 is set to the following values corresponding to used treatment solutions.

| | | |
|---|---|---|
| Sulfuric acid and hydrogen peroxide solution ($H_2SO_4 + H_2O_2$) | 120–150° C. | 80% |
| Phosphoric acid | 150–180° C. | 80% |
| Ammonia and hydrogen peroxide solution ($NHO_3 + H_2O_2$) | 60–70° C. | 40% |
| Hydrochloric acid and hydrogen peroxide solution ($HCL + H_2O_2$) | 60–70° C. | 40% |
| Demineralized water treated with sulfuric acid and hydrogen peroxide solution | 25° C. | 40% |
| Demineralized water | 25° C. | 20% |

In this apparatus of the first embodiment, air curtain $D_1$ and $D_2$ are formed by guiding downflow F produced from clean air unit 18. Accordingly, it is not necessary to provide an air curtain device separately. It is also possible to form air curtains $D_1$ and $D_2$ by taking in a downflow in a clean room and guiding it into gap S instead of the downflow produced from clean air unit 18.

Figure 8A:
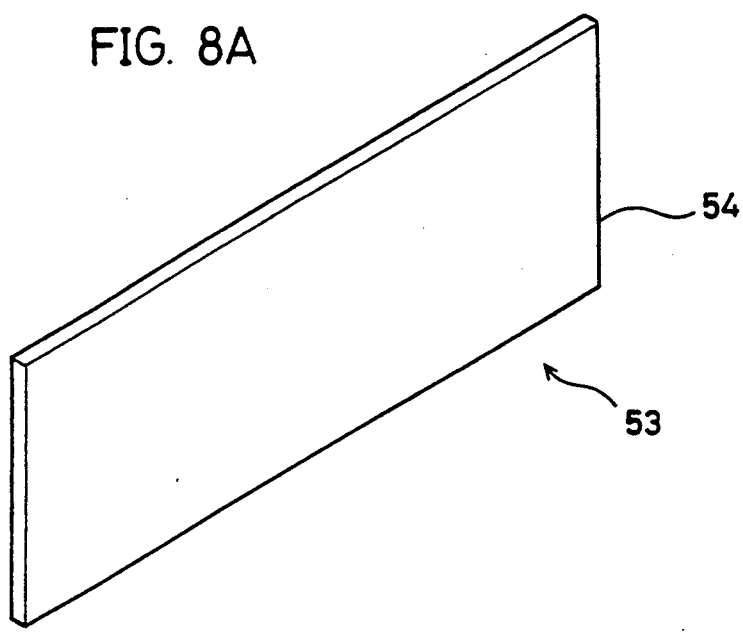
FIG. 8A is a schematic perspective view illustrating another example of a shutter plate.

FIG. 8A shows another shutter mechanism 53 which can be used in place of shutter mechanism 50 shown in FIG. 4A. Referring to FIG. 8A, this shutter mechanism 53, in departure from the shutter plate 51 shown in FIG. 4A, includes a shutter plate 54 with a smaller thickness having no air path and a driving device not shown.

Figure 8B:
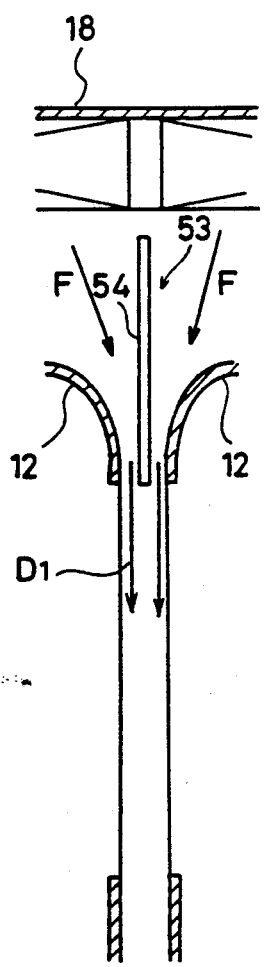
FIGS. 8B and 8C are side cross-sectional view of a housing end in the case where the shutter plate shown in FIG. 8A is employed.

Referring to FIG. 8B, when shutter plate 54 is pulled up, the downflow F from clean air unit 18 is guided by guide plates 12, and jetted toward gap S from gaps between guide plates 12 and shutter plate 54 to form air shutter $D_1$.

Figure 8C:
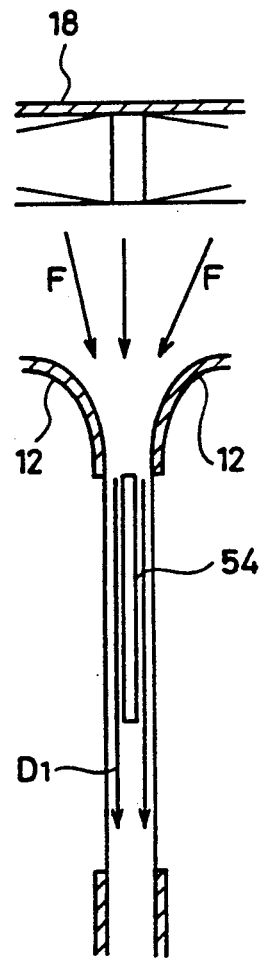

Referring to FIG. 8C, when the shutter plate 54 is down, the downflow F formed by clean air unit 18 is guided by guide plates 12, flows down along both sides of shutter plate 54 to form air shutter $D_1$ at the opening.

As described above, using such a shutter mechanism as shown in FIGS. 8A through 8C instead of the shutter mechanism shown in FIGS. 4A through 4C, contamination substances are prevented from getting into surface treatment chambers through the opening from outside. If the velocity of downflow F produced from clean air unit 18 is large enough, such shutter mechanisms are not required. Also, when a dedicated air shutter mechanism is provided above its opening, a shutter plate for opening/closing an upper half of the opening is not required, either.

Figure 9:
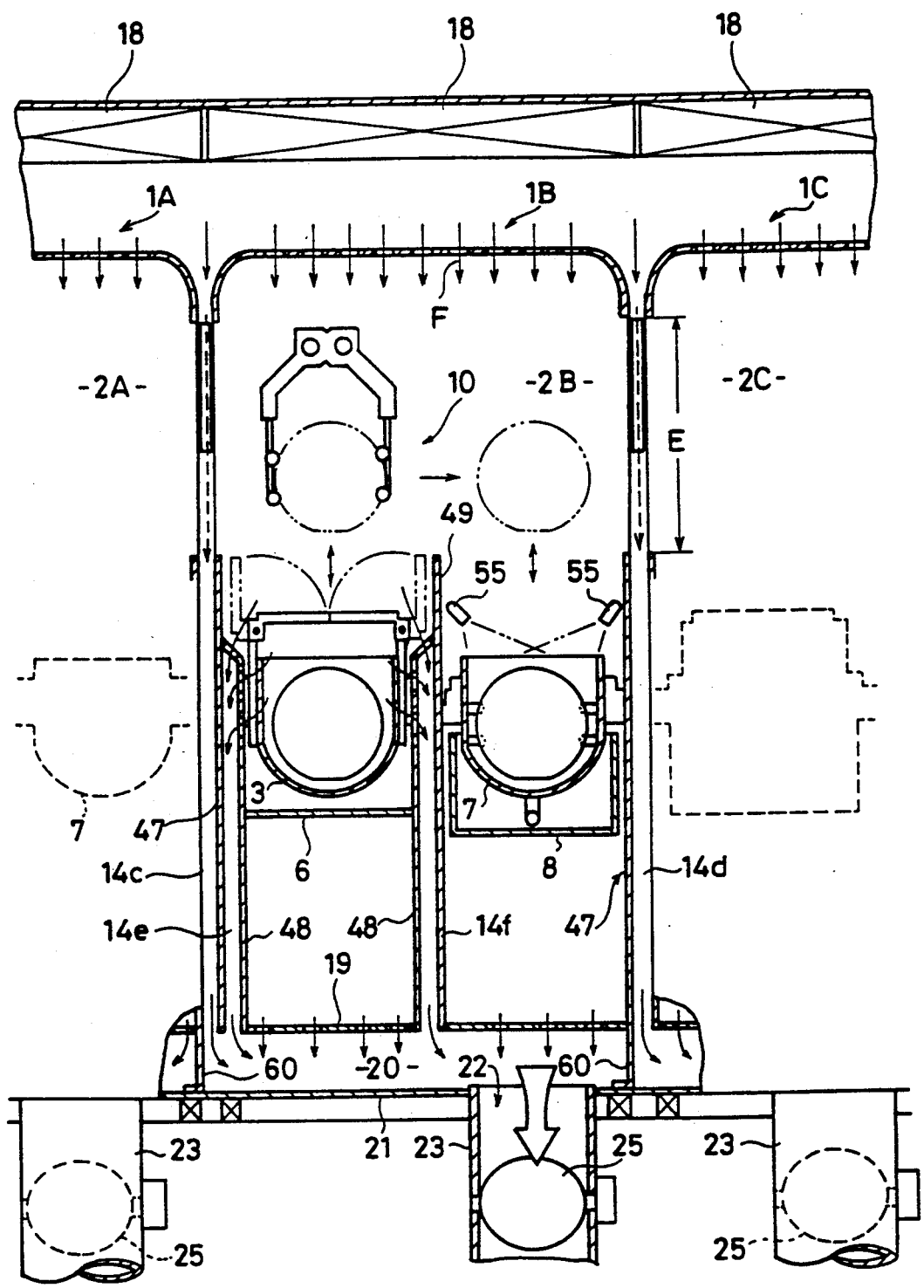
FIG. 9 is a front cross-sectional view of a dipping type wafer treatment apparatus according to the second embodiment of the present invention.

Referring to FIG. 9, a surface treatment apparatus according to the second embodiment of the present invention is different from the apparatus of the first embodiment in the following points. Partition 49 extends to separating wall 19 on the bottom of surface treatment chamber 2B. A duct wall 48 is provided on the etching bath 3 side of a sidewall 47 and a partition 49, where sidewall 47 and duct wall 48, partition 49 and duct wall 48 define communicating ducts 14e and 14f, respectively. An air inlet is provided in the vicinity of etching bath 3 in duct wall 48. Communicating ducts 14e, 14f open to bottom communicating chamber 20. In the apparatus shown in FIG. 9, neither common drain tray 9 nor a drain pipe 43 as shown in FIG. 3 are provided. Bottom communicating chamber 20 below respective surface treatment devices 1A, 1B and 1C are partitioned by partition 60. Provided in each bottom communicating chamber 20 is an air outlet 22, to which a forced exhaust duct 23 is connected. A flow rate adjusting valve 25 is provided inside each forced exhaust duct 23.

Since operation of the apparatus shown in FIG. 9 is similar to that of the apparatus of the first embodiment, the details thereof are not repeated here. In the apparatus shown in FIG. 9, as its bottom communicating chamber 20 is partitioned, the negative pressure inside bottom communicating chamber 20 is large. Accordingly, forced exhaustion from each of surface treatment chambers 2A, 2B and 2C can be performed more efficiently. Because communicating ducts 14e, 14f are provided around etching bath 3, etching solution mist is efficiently exhausted through these ducts 14e, 14f.

In the apparatus shown in FIG. 9, a duct for exhausting air around rinsing bath 7 is not provided. However, the present invention is not limited to the same and a communicating duct for exhausting air around rinsing bath 7 can be provided.

Figure 10:
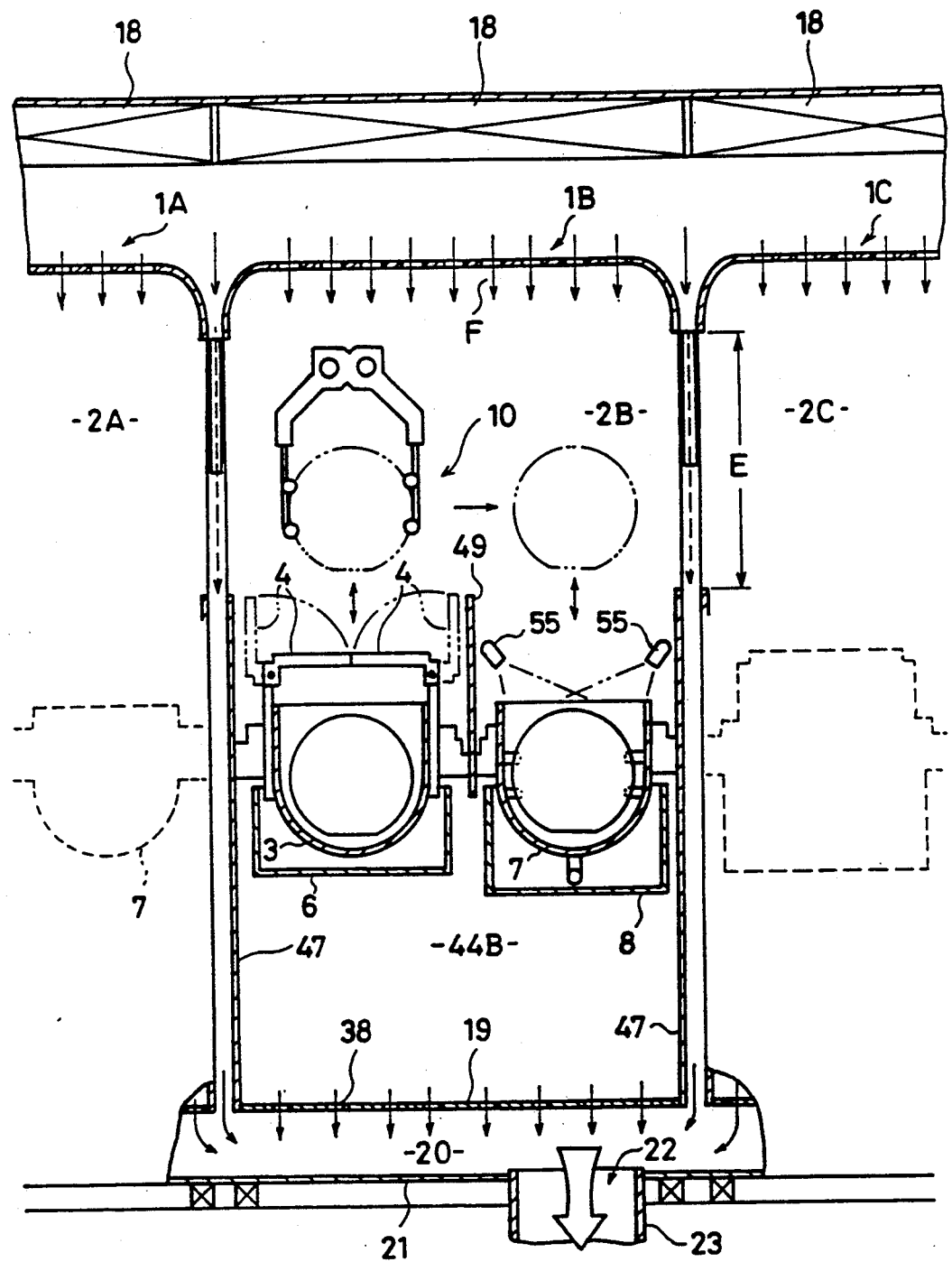
FIG. 10 is a front cross-sectional view of a dipping type wafer treatment apparatus according to the third embodiment of the present invention.

Referring to FIG. 10, a surface treatment apparatus according to the third embodiment of the present invention is different from the apparatus of the first embodiment in the following points. In the apparatus of the third embodiment, a common drain tray 9 is not provided. A piping chamber 44B is defined below etching bath 3 and rinsing bath 7. Piping chamber 44B communicates with an upper space of surface treatment chamber 2B through an opening formed around etching bath 3 and rinsing bath 7. Piping chamber 44B also communicates with the bottom communicating chamber 20 by holes 38 formed in separating wall 19.

Accordingly, in the apparatus of this embodiment, piping chamber 44B can be regarded as a communicating duct. In FIGS. 3 and 10, the same reference numerals and names are assigned to the same parts. The functions thereof are also the same. Accordingly, detailed description thereof is not repeated here.

In the apparatus shown in FIG. 10, the downflow F flowing down from clean air unit 18 reaches piping chamber 44B through the opening around etching bath 3 and rinsing bath 7. The mist produced from an etching solution inside etching bath 3 at this time is transferred into piping chamber 44B by the downflow F. Air inside piping chamber 44B further moves into bottom communicating chamber 20 due to the negative pressure produced by a pump (not shown). The etching solution mist is rapidly exhausted outside of bottom communicating chamber 20 together with the downflow F. Accordingly, the treatment solution mist can also be effectively exhausted by the apparatus shown in FIG. 10. Also in this apparatus, the position of air outlet 22 can be selected freely. Accordingly, the provision of forced exhaust duct 23 can be arranged easily.

Figure 11:
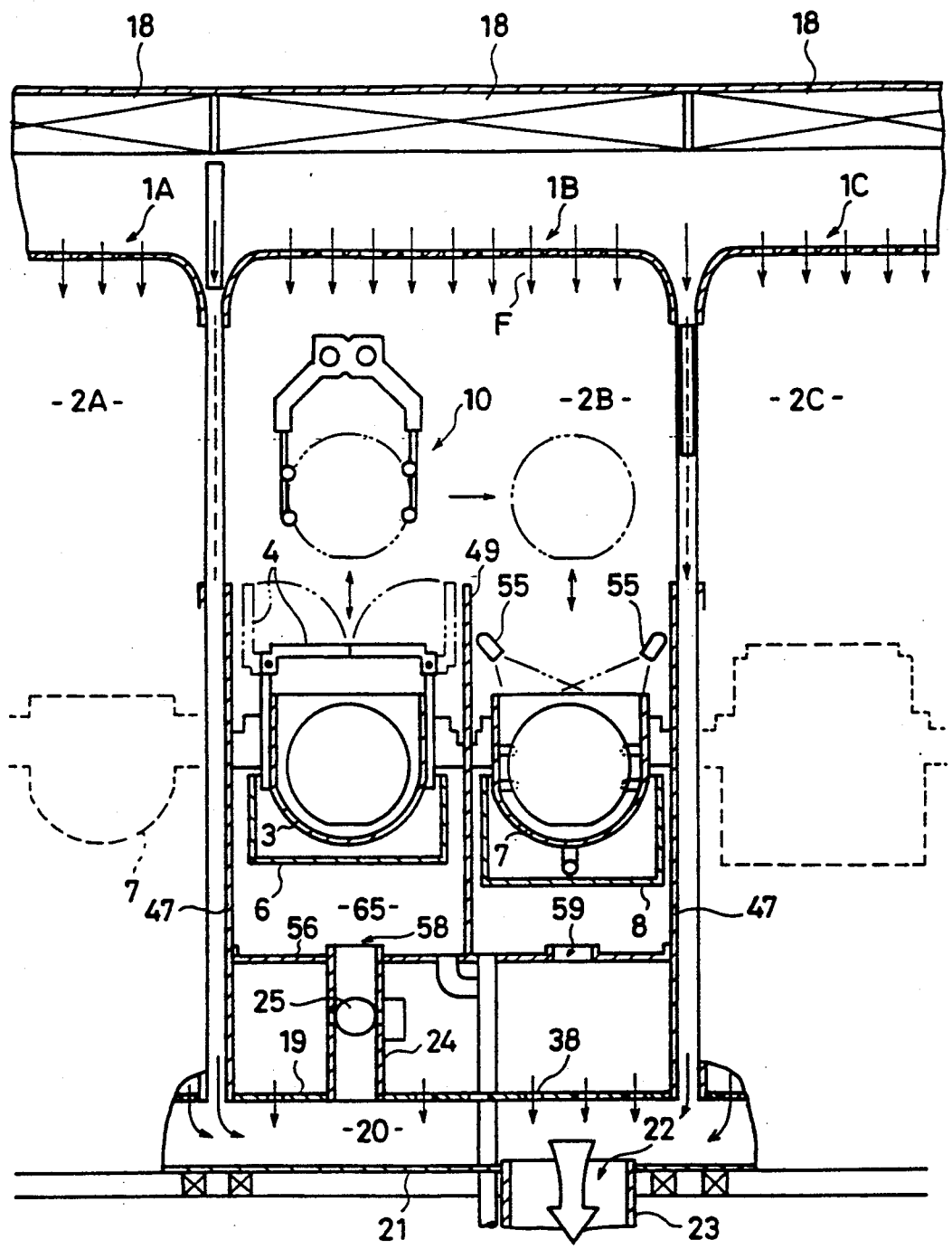
FIG. 11 is a front cross-sectional view of a dipping type wafer treatment apparatus according to the fourth embodiment of the present invention.

Referring to FIG. 11, a wafer surface treatment apparatus according to the fourth embodiment of the present invention is different from the apparatus of the first embodiment in the following points. The apparatus includes, in place of common drain tray 9 shown in FIG. 2, a partition 56 having an air outlet 58 below etching bath 3 and an air outlet 59 below rinsing bath 7 respectively, and a communicating duct 24 for coupling air outlet 58 with bottom communicating chamber 20. A flow rate adjusting valve 25 having the same structure as flow rate adjusting valve 25 shown in FIG. 2 is provided in communicating duct 24.

In this apparatus, different from the apparatus shown in FIG. 2, the flow rate adjusting valve 25 is not provided in forced exhaust duct 23. In the apparatus shown in FIG. 11, the lower edge of partition 49 extends to partition 56 and is connected to the partition 56. Sidewall 47, partition 49 and partition 56 define an etching chamber 65 for accommodating etching bath 3.

In FIGS. 11 and 2, the same reference numbers and names are assigned to the same parts. The functions thereof are also the same. Accordingly, detailed description thereof is not repeated here.

In FIG. 11, the mist of etching solution produced from etching bath 3 is guided to a lower portion of etching chamber 65 by downflow F flowing down inside surface treatment chamber 2B. The mist and the downflow F guided to the lower portion of etching chamber 65 is led by the negative pressure inside bottom communicating chamber 20 through communicating duct 24 to bottom communicating chamber 20. The mist is further exhausted out through air outlet 22 and forced exhaust duct 23. The opening angle of flow rate adjusting valve 25 is adjusted in association with opening/closing of lids 4 of etching bath 3 by a controlling circuit (not shown). Accordingly, in this case, the treatment solution mist produced from etching treatment bath 3 can be more efficiently exhausted.

Figure 12:
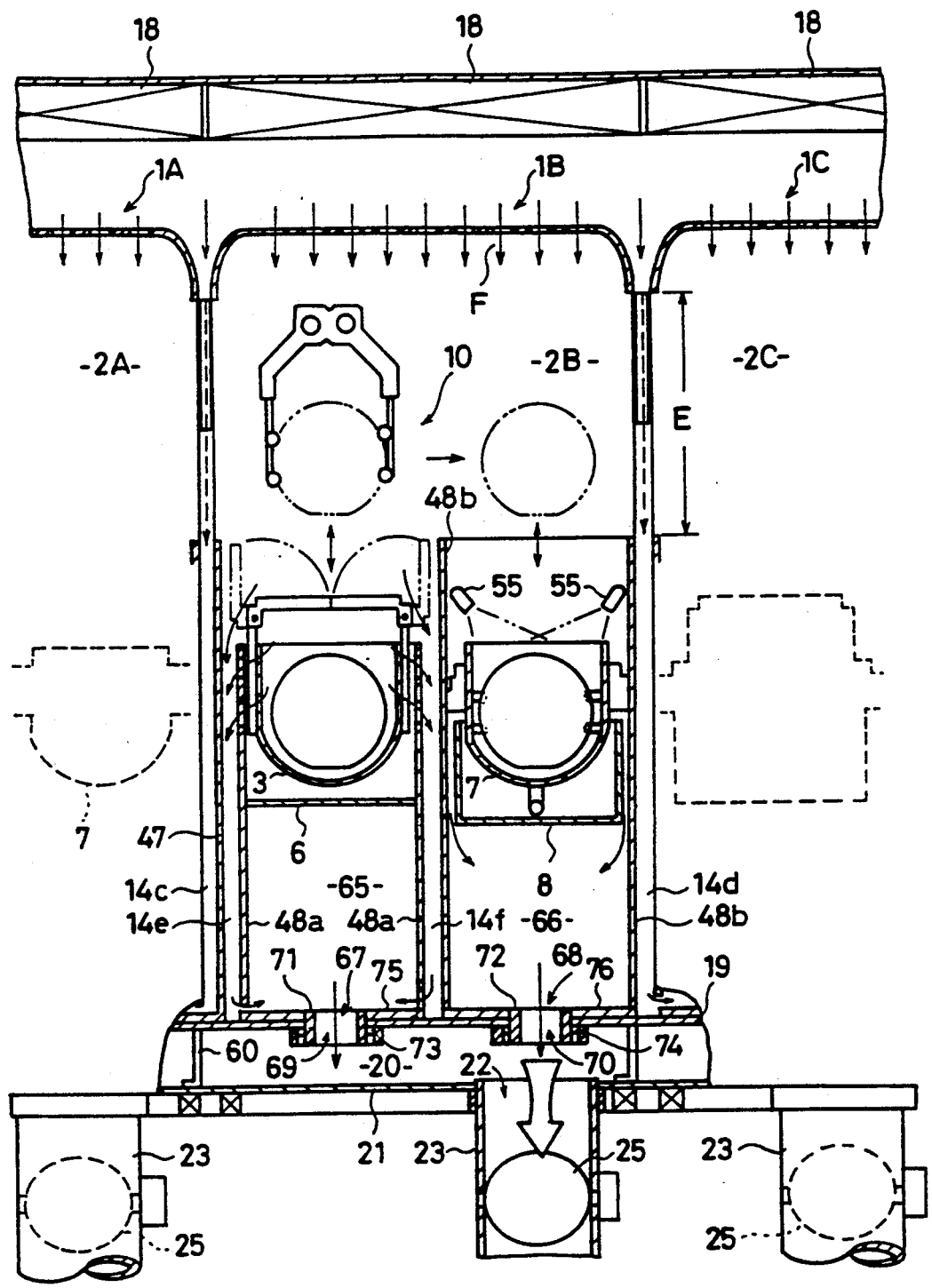
FIG. 12 is a front cross-sectional view of a dipping type wafer treatment, apparatus according to the fifth embodiment of the present invention.

FIG. 12 is a cross-sectional view of a surface treatment apparatus for wafers according to the fifth embodiment of the present invention. The apparatus shown in FIG. 12 is different from the apparatus shown in FIGS. 1 through 7 in the following points. Provided inside surface treatment chamber 2B of the surface treatment device 1B shown in FIGS. 10 are duct walls 48a, 48b, respectively defining an etching chamber 65 and a rinsing chamber 66.

An etching bath 3 is provided in an upper part of etching chamber 65. An overflow receptacle 6 is provided below etching bath 3. The bottom of etching chamber 65 is defined by a bottom wall 75 having an air outlet 67. An opening 69 is formed in a separating wall 19 of the bottom communicating chamber 20 corresponding to air outlet 67. Bottom wall 75 and separating wall 19 are coupled with each other by a coupling member 71 inserted into air outlet 67 and opening 69. A packing 73 is interposed between coupling member 71 and separating wall 19.

The bottom of rinsing chamber 66 is defined by a bottom wall 76 having an air outlet 68. An opening 70 is formed in separating wall 19 at a portion corresponding to air outlet 68. Bottom wall 76 and separating wall 19 are coupled with each other by a coupling member 72 respectively inserted into air outlet 68 and opening 70. A packing 74 is interposed between an outer side of coupling member 72 and separating wall 19.

Bottom communicating chamber 20 formed below respective surface treatment devices 1A, 1B and 1C are divided by partitions 60 from each other. An air outlet 22 is provided in each bottom communicating chamber 20, to which a forced exhaust duct 23 is connected. A flow rate adjusting valve 25 is provided inside each forced exhaust duct 23.

In FIGS. 12 and 2, the same reference characters and names are assigned to the same parts. The functions thereof are also the same. Accordingly, detailed description thereof is not repeated here.

Sidewall 47 and duct wall 48a of the surface treatment device 1B on the surface treatment device 1A side defines a communicating duct 14e. An opening is formed at a lower portion of duct wall 48a, through which communicating duct 14e and a lower space of etching chamber 65 communicate with each other.

Communicating duct 14f is defined by duct walls 48a and 48b between etching chamber 65 and rinsing chamber 66. An opening is formed at a lower portion of duct wall 48a, through which communicating duct 14f communicates with a lower space inside etching chamber 65.

The feature of the apparatus shown in FIG. 12 is that a device for etching and a device for rinsing can be easily made as a unit as shown by etching chamber 65 and rinsing chamber 66. Provision of openings 69, 70 at a predetermined spacing in separating wall 19 in advance enables attachment of units having various structures and shapes to the openings 69 and 70. Accordingly, by selecting units corresponding to a function to be implemented, different functions can be easily implemented inside a surface treatment apparatus having the same structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dipping type wafer treatment apparatus comprising:
    a housing having first and second openings through which a wafer can pass, said housing defining a space in which the wafer is treated;
    a wafer treatment bath provided inside said housing;
    means provided above said housing for producing a downflow of air;
    gas flow introducing means provided at an upper part of said housing for introducing said air downflow into said housing;
    bottom enclosing means provided below said housing being partitioned from said housing for defining an enclosed spaced in which gas can pass and having an air outlet for gas to outside;
    first air guiding means for guiding air in the vicinity of said treatment bath inside said housing into said enclosed space;
    means for forcing out the air inside said enclosed space from said air outlet;
    air flow guiding means provided in association with said first opening for guiding an air downflow from said air downflow producing means along an outer wall of said housing from a portion above said first opening for forming an air curtain to prevent air inside and outside said housing from mixing with each other; and
    means for further guiding the air flow guided by said air flow guiding means into said enclosed space.

2. The dipping type wafer treatment apparatus according to claim 1, further comprising partially sealing means movable between a first position at which an upper part of said first opening is sealed and a second position at which said first opening is substantially opened.

3. The dipping type wafer treatment apparatus according to claim 2, wherein
    said partially sealing means includes a partially sealing plate provided movably between said first position and said second position substantially in contact with an outer wall of said first opening of said housing, and said partially sealing plate has an upper edge and a lower edge and also has an air path from said upper edge to said lower edge, wherein said air downflow passes said air path of said partially sealing means to form an air curtain in a remaining portion of said first opening when said partially sealing plate is at said second position.

4. The dipping type wafer treatment apparatus according to claim 2, wherein said partially sealing means includes a partially sealing plate provided with a predetermined space apart from an outer wall of said housing in which said first opening is provided and movably between said first position and said second position, and said predetermined space being allowing air to pass therethrough.

5. The dipping type wafer treatment apparatus according to claim 1, further comprising:
    wafer conveyor means for conveying wafers along a predetermined wafer conveying route from said first opening toward said second opening so that the wafers are dipped into a treatment solution inside said treatment bath for a predetermined time period;
    cover means provided at an opening of said treatment bath for opening and closing the opening of said treatment bath;
    exhaust amount limiting means for limiting an amount of air exhausted through said air outlet from said enclosed space defined by said bottom enclosing means; and
    controlling means for driving said cover means and said exhausted amount limiting means to operate in association with dipping of the wafers into said treatment bath and retrieval thereof by said wafer conveyor means.

6. The dipping type wafer treatment apparatus according to claim 5, wherein said exhaust amount limiting means includes a valve element provided inside said air guiding means for changing a minimum cross section of the air flow path inside said air guide means being controlled by said controlling means.

7. The dipping type wafer treatment apparatus according to claim 5, wherein
said forced exhaust means includes
an exhaust duct connected to said air outlet of said enclosed space, and
a forced exhaust pump connected to said exhaust duct, and
said exhaust amount limiting means includes
a valve element provided inside said exhaust duct for changing a minimum cross section of the air flow path inside said exhaust duct, and
valve element driving means connected to said controlling means for driving said valve element, said valve element driving means being controlled by said controlling means.

8. The dipping type wafer treatment apparatus according to claim 1, wherein said apparatus comprises first and second treatment baths.

9. The apparatus according to claim 8, further comprising:
inner partitioning means for partitioning a space below said first treatment bath from the space inside said housing; and
second air guiding means having an air inlet provided in said inner partitioning means and an air outlet opening to said enclosed space for guiding air in the vicinity of said first treatment bath inside said inner partitioning means into said enclosed space.

10. The apparatus according to claim 9, wherein
a bottom of said inner partitioning means is partitioned by an upper partitioning wall of said bottom enclosing means, and
said upper partitioning wall has an opening for making said inner partitioning means and said enclosed space communicate with each other.

11. The apparatus according to claim 8, further comprising:
inner partitioning means for partitioning a lower space of said first treatment bath from another space of said housing; and
said first air guiding means including a duct for making said inner partitioning means and said enclosed space directly communicate with each other.

12. The dipping type wafer treatment apparatus according to claim 11, further comprising:
cover means for opening and closing an opening of said first treatment bath;
air flow amount limiting means provided in said duct for limiting air flow amount inside said duct; and
controlling means for controlling said cover means and said air flow amount controlling means so that they operate in association with each other.

13. The dipping type wafer treatment apparatus according to claim 8, wherein
said bottom enclosing means has an upper partitioning wall for partitioning said housing and said enclosed space,
communicating openings for making said housing and said enclosed space communicate with each other are respectively formed in said upper partitioning wall below each of said first and second treatment baths; and
said first air guiding means includes,
inner partitioning means provided inside said housing for separating said second treatment bath from vapor produced from said first treatment bath and having an air outlet for exhausting air inside, and
first coupling means for detachably coupling said inner partitioning means and said upper partitioning wall so that said air outlet of said inner partitioning means and said communicating opening provided below said second treatment bath communicate with each other.

14. The apparatus according to claim 13, wherein
said first air guiding means further includes holding means separated from said housing for holding said first treatment bath inside said housing, and
said holding means includes
a peripheral wall having an opening through which wafers can pass at its upper portion and an opening at its periphery through which air can flow for holding said first treatment bath inside,
a bottom wall having an air outlet formed at a position corresponding to said communicating opening formed below said first treatment bath, fixed at a lower portion of said peripheral wall, for stably setting said holding means in said housing, and
second coupling means for detachably coupling said holding means to said upper portion partitioning wall so that said air outlet of said bottom wall and said communicating opening formed below said first treatment bath communicate with each other.

15. A dipping type wafer treatment apparatus comprising:
a plurality of wafer treatment units arranged in a series;
means provided above said wafer treatment units for producing a downflow of air;
bottom enclosing means provided below said wafer treatment units being partitioned from said wafer treatment units for defining an enclosed space in which gas can pass and having an air outlet for gas to outside; and
means for forcing out the air inside said enclosed space from said air outlet,
each of said wafer treatment units comprising,
a housing having first and second openings through which a wafer can pass, said housing defining a space in which the wafer is treated,
a wafer treatment path provided inside said housing,
gas flow introducing means provided at an upper part of said housing for introducing said air downflow into said housing,
first air guiding means for guiding air in the vicinity of said treatment gas inside said housing into said enclosed space,
second air flow guiding means provided in association with said first opening for guiding an air downflow from said air downflow producing means along an outer wall of said housing from a portion above said first opening for forming an air curtain to prevent air inside and outside said housing from mixing with each other, and
means for further guiding the air flow guided by said second air flow guiding means into said enclosed space.

16. A dipping type wafer treatment apparatus comprising:
a housing having openings for the passage of a wafer therethrough and defining a space in which the wafer is treated;

a wafer treatment bath inside said housing;

means for producing a flow of air;

a gas flow introducing means provided at a predetermined part of said housing for introducing said air flow into said housing;

enclosing means for defining an enclosed space outside said housing in which gas can pass, said enclosed space having an air outlet for gas to exit therefrom;

air guiding means for guiding air form the vicinity of said treatment bath into said enclosed space;

further air flow guiding means for guiding an air flow developing from said air flow producing means along an outer wall of said housing from one of said openings of said housing for forming an air curtain to prevent air inside and outside said housing from mixing with each other; and means for further guiding the air flow guided by said further air flow guiding means into said enclosed space.

* * * * *